United States Patent
Zhu

(10) Patent No.: US 10,665,640 B2
(45) Date of Patent: May 26, 2020

(54) PIXEL ARRAY STRUCTURE AND DISPLAY DEVICE

(71) Applicant: BOE TECHNOLOGY GROUP CO., LTD., Beijing (CN)

(72) Inventor: Mingyi Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 117 days.

(21) Appl. No.: 14/907,951

(22) PCT Filed: Sep. 16, 2015

(86) PCT No.: PCT/CN2015/089728
§ 371 (c)(1),
(2) Date: Jan. 27, 2016

(87) PCT Pub. No.: WO2016/127640
PCT Pub. Date: Aug. 18, 2016

(65) Prior Publication Data
US 2016/0240594 A1    Aug. 18, 2016

(30) Foreign Application Priority Data
Feb. 15, 2015   (CN) .......................... 2015 1 0083287

(51) Int. Cl.
*H01L 27/32* (2006.01)
(52) U.S. Cl.
CPC ...... *H01L 27/3218* (2013.01); *H01L 27/3216* (2013.01)

(58) Field of Classification Search
CPC .................. H01L 27/3216; H01L 27/3218
See application file for complete search history.

(56) References Cited

U.S. PATENT DOCUMENTS

| 6,903,754 B2 | 6/2005 | Brown Elliott |
| 8,134,583 B2 | 3/2012 | Credelle |
| 2003/0128225 A1* | 7/2003 | Credelle ........... G02F 1/133514 345/694 |

(Continued)

FOREIGN PATENT DOCUMENTS

| CN | 1539132 A | 10/2004 |
| CN | 1639765 A | 7/2005 |

(Continued)

OTHER PUBLICATIONS

Search Report and Written Opinion dated Dec. 15, 2015 from State Intellectual Property Office of the P.R. China.

(Continued)

*Primary Examiner* — Shaun M Campbell
*Assistant Examiner* — Aneta B Cieslewicz
(74) *Attorney, Agent, or Firm* — Dilworth & Barrese, LLP.; Michael J. Musella, Esq.

(57) ABSTRACT

A pixel array structure and a display device are provided. The pixel array structure includes pixel groups arranged repeatedly, wherein each pixel group at least includes a first pixel (21), a second pixel (22) and a third pixel (23), each type of pixels include sub-pixels of at least two colors, and sub-pixels included in different types of pixels are different in color or sequence, which can improve aperture ratios of part of color sub-pixels.

20 Claims, 7 Drawing Sheets

(56) References Cited

U.S. PATENT DOCUMENTS

| | | | |
|---|---|---|---|
| 2005/0225575 A1* | 10/2005 | Brown Elliott | G02F 1/133514 |
| | | | 345/694 |
| 2009/0128467 A1 | 5/2009 | Chen | |
| 2009/0309821 A1 | 12/2009 | Tanno | |
| 2013/0021566 A1* | 1/2013 | Akitomo | G02F 1/13394 |
| | | | 349/108 |
| 2013/0027437 A1* | 1/2013 | Gu | G09G 3/3607 |
| | | | 345/690 |
| 2013/0234917 A1* | 9/2013 | Lee | H01L 27/3218 |
| | | | 345/82 |
| 2016/0204094 A1* | 7/2016 | Yang | H01L 27/124 |
| | | | 257/773 |

FOREIGN PATENT DOCUMENTS

| | | | |
|---|---|---|---|
| CN | 101325027 A | 12/2008 | |
| CN | 103187431 A | 7/2013 | |
| CN | 103208507 A | 7/2013 | |
| CN | 103715227 A | 4/2014 | |
| CN | 103887323 A | 6/2014 | |
| CN | 204102903 U | 1/2015 | |
| CN | 104347679 A | 2/2015 | |
| CN | 104617131 A | 5/2015 | |

OTHER PUBLICATIONS

Chinese Office Action dated Jan. 23, 2017.
Second Chinese Office Action dated Sep. 15, 2017.

\* cited by examiner

PIXEL ARRAY STRUCTURE AND DISPLAY DEVICE

TECHNICAL FIELD

At least one embodiment of the present invention relates to a pixel array structure and a display device.

BACKGROUND

In order to improve a display resolution of an Organic Light Emitting Diode (OLED) display device, thereby improving a display quality, a pentile array is adopted in arranging sub-pixels. The pentile array is an arrangement manner for red (R), green (G), blue (B) sub-pixels in a display device, which uses OLED materials. The pentile array is a technology generated with birth of the OLED display materials; in the pentile array, light-emitting areas of three R, G and B sub-pixels are different, and display areas of the red sub-pixel and the blue sub-pixel are two times as large as that of the green sub-pixel.

A traditional pixel point is formed by three R, G and B sub-pixels, and in the pentile array, a single pixel point is different; each pixel point is only formed by sub-pixels of two colors, and generally the pentile array only includes two types of pixels: RG and BG. However, only three primary colors can form all of the colors, and only two colors are not able to form all colors, so in actual image display, in the pentile array, one pixel point will borrow another color from a pixel point adjacent thereto, to form the three primary colors. In a horizontal direction or a vertical direction, each pixel and its adjacent pixel share a sub-pixel of a color it does not have, to achieve white display jointly.

In summary, in an OLED display in the prior art, when the sub-pixels are arranged in a pentile array manner, only two types of pixels formed by sub-pixels of different colors are included, which may cause relatively low aperture ratios of part of color sub-pixels; for example, if, in a single pixel point of the pentile array, one is a pixel formed by R and G sub-pixels, and the other is a pixel formed by B and G sub-pixels, and then aperture ratios of the red sub-pixel and the blue sub-pixel are relatively low.

SUMMARY

At least one embodiment of the present invention relates to a pixel array structure, including pixel groups arranged repeatedly, wherein each pixel group includes a plurality of pixels arranged along a row direction and a column direction, the plurality of pixels at least include a first type of pixels, a second type of pixels and a third type of pixels, each type of pixels include sub-pixels of at least two colors, and sub-pixels included in different types of pixels are different in color or sequence.

At least one embodiment of the present invention provides a display device, including the pixel array structure described above.

BRIEF DESCRIPTION OF THE DRAWINGS

In order to clearly illustrate the technical solution of the embodiments of the present invention, the drawings of the embodiments will be briefly described in the following; it is obvious that the described drawings are only related to some embodiments of the present invention and thus are not limitative of the present invention.

DETAILED DESCRIPTION

Figure 1:
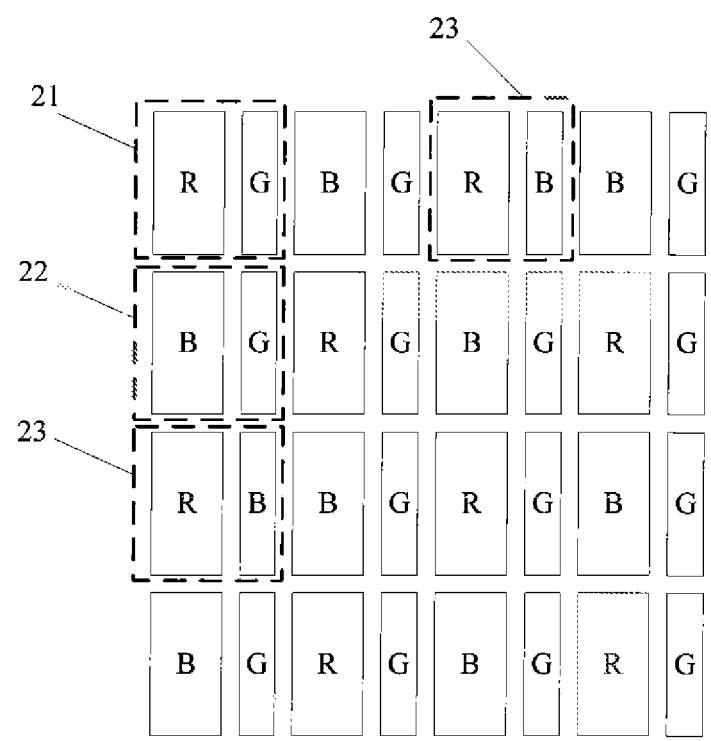
FIG. 1 is a schematic diagram of a type of pixel array structure provided by an embodiment of the present invention.

In order to make objects, technical details and advantages of the embodiments of the present invention apparent, the technical solutions of the embodiment will be described in a clearly and fully understandable way in connection with the drawings related to the embodiments of the present invention. It is obvious that the described embodiments are just a part but not all of the embodiments of the invention. Based on the described embodiments herein, those skilled in the art can obtain other embodiment(s), without any inventive work, which should be within the scope of the present invention.

Embodiments of the present invention provide a pixel array structure and a display device, for improving aperture ratios of part of color sub-pixels.

An embodiment of the present invention provides a pixel array structure, including pixel groups arranged repeatedly. Different pixel groups are arranged in a same manner, or the pixel groups are duplicated in a certain manner. Each pixel group at least includes three types of pixels: a first pixel, a second pixel and a third pixel, each type of pixels include sub-pixels of at least two colors, and sub-pixels included in different types of pixels are different in color or sequence.

The pixel array structure includes pixel groups arranged repeatedly, wherein each pixel group at least includes three types of pixels: a first pixel, a second pixel and a third pixel, each type of pixels include sub-pixels of at least two colors, and sub-pixels included in different types of pixels are different in color or sequence. Thus, the pixel groups according to the embodiment of the present invention include a plurality of pixels, and are arranged repeatedly in a unit of pixel group. Taking an example that a pixel group includes three types of pixels, basically, there are totally three types of pixels in sub-pixel arrangement in the embodiment of the present invention: "red and blue", "red and green" and "blue and green", and the "red and blue" is generally connected with the "blue and green"; when fabricating a Fine Metal Mask (FMM), a same hole may be opened with adjacent blue sub-pixels, to increase an opening area; as compared with the arrangement of only two types of pixels, the "red and green", the "blue and green" in current pentile array, the embodiment of the present invention can improve an aperture ratio of the blue sub-pixels, and lower requirement on fabrication accuracy of the FMM, thereby reducing difficulty in fabricating the pixels. An overall life time of an OLED product depends on characteristics of OLED materials; in general, a blue material has relatively short life time, which is a main reason of affecting life time of the product. Therefore, as compared with the pentile array only having RG and BG in the prior art, in the embodiment of the present invention, a number of blue sub-pixels is increased, life time of the blue color may be prolonged by improving an aperture ratio of the blue sub-pixels, so as to prolong a service life of the product. Similarly, if the three types of pixels are "blue and red", "red and green "and "blue and green", the "blue and red" is generally connected with the "red and green", to improve an aperture ratio of the red sub-pixels. If there are four types of pixels: "red and blue", "red and green", "blue and green" and "blue and red", which are arranged in a same manner as above, the "blue and red" may be arranged adjacent to the "red and green", so as to improve an aperture ratio.

Of course, each pixel group may have more types of pixels, which specifically depends on color types of sub-pixels, the more the color types of sub-pixels are, the more the types of pixels may be combined.

Optionally, in the pixel array structure provided by the embodiment of the present invention, in any pixel group, pixels of a same type are not adjacent to each other in a horizontal direction and a vertical direction, but may be adjacent to each other in a diagonal direction, so as to achieve an advantageous effect that different types of pixels are uniformly distributed, which also facilitates borrowing pixels from the pixels in directions of above and below, or left and right.

Optionally, the first pixel includes a first color sub-pixel and a second color sub-pixel; the second pixel includes a third color sub-pixel and a second color sub-pixel; and the third pixel includes a first color sub-pixel and a third color sub-pixel. That is, in some embodiments, there may be sub-pixels of three colors, so that three types of pixels may be generated by combining any two of them.

Optionally, the pixels of the same type are not adjacent to each other in a horizontal direction and a vertical direction.

Optionally, in the embodiment of the present invention, each sub-pixel may be in a polygonal shape, for example, a rectangle, a diamond, a triangle, and other irregular polygon and so on.

Optionally, the first color sub-pixel is a red pixel (which may be represented by R); the second color sub-pixel is a green pixel (which may be represented by G); and the third color sub-pixel is a blue pixel (which may be represented by B).

Optionally, in the pixel array structure provided by the embodiment of the present invention, each pixel group includes m*n pixels of m rows and n columns, wherein, m and n may be natural numbers greater than or equal to 2. In a same column of pixels, a first sub-pixel column includes a red sub-pixel and a blue sub-pixel, and a second sub-pixel column includes: a green sub-pixel, or a green sub-pixel and a blue sub-pixel, or a green sub-pixel and a red sub-pixel, or a green sub-pixel, a red sub-pixel and a blue sub-pixel; or, in a same column of pixels, a first sub-pixel column includes: a green sub-pixel, or a green sub-pixel and a blue sub-pixel, or a green sub-pixel and a red sub-pixel, or a green sub-pixel, a red sub-pixel and a blue sub-pixel, and a second sub-pixel column includes a red sub-pixel and a blue sub-pixel.

Optionally, referring to FIG. 1. each pixel group includes 16 pixels of four rows and four columns, which include three types of pixels: a first pixel RG 21, a second pixel BG 22 and a third pixel RB 23, respectively. The pixel group illustrated in FIG. 1 includes 6 first pixels RG 21, 6 second pixels BG 22 and 2 third pixels RB 23.

In FIG. 1 each pixel group includes 16 pixels of four rows and four columns, which have three types: RG, BG and RB, respectively, wherein, pixels in the second column of pixels and the fourth column of pixels are arranged in a same manner, which are a BG pixel, a RG pixel, a BG pixel and a RG pixel from top to bottom, respectively; pixels in the first column of pixels are arranged in such a manner that a RG pixel, a BG pixel, a RB pixel and a BG pixel are arranged from top to bottom, respectively; and pixels in the third column of pixels are arranged in such a manner that a RB pixel, a BG pixel, and a RG pixel and a BG pixel are arranged from top to bottom, respectively. The BG pixel is a pixel of a blue sub-pixel and a green sub-pixel from left to right, respectively; the RG pixel is a pixel of a red sub-pixel and a green sub-pixel from left to right, respectively; and the RB pixel is a pixel of a red sub-pixel and a blue sub-pixel from left to right, respectively. As compared with the pentile array only having RG and BG in the prior art, in the pixel group illustrated in the embodiment of FIG. 1, a number of blue sub-pixels is increased, life time of the blue color may be prolonged by improving an aperture ratio of the blue sub-pixels, so as to prolong a service lite of the product.

FIG. 1 is only an example, of course, there may be other variations, for example, in the embodiment of the present invention, it may further be that: each pixel group includes 16 pixels of four rows and four columns, wherein, pixels in the second column of pixels and the fourth column of pixels are arranged in a same manner, which are a GB pixel, a GR pixel, a GB pixel and a GR pixel from top to bottom, respectively; pixels in the first column of pixels are arranged in such a manner that a GR pixel, a GB pixel, a BR pixel and a GB pixel are arranged from top to bottom, respectively; and pixels in the third column of pixels are arranged in such a manner that a BR pixel, a GB pixel, a GR pixel and a GB pixel are arranged from top to bottom, respectively. The GB pixel is a pixel of a green sub-pixel and a blue sub-pixel from left to right, respectively; the GR pixel is a pixel of a green sub-pixel and a red sub-pixel from left to right, respectively; and the BR pixel is a pixel of a blue sub-pixel and a red sub-pixel from left to right, respectively.

As illustrated in FIG. 1, a second sub-pixel colunm in a same column of pixels includes: a green sub-pixel, or a green sub-pixel and a blue sub-pixel.

Figure 2:
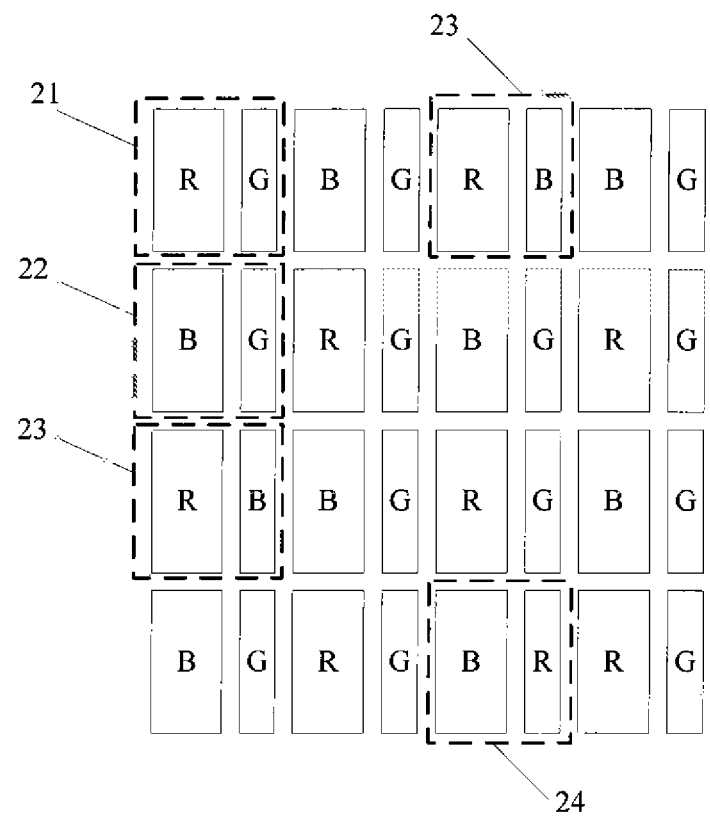
FIG. 2 is a schematic diagram of another type of pixel array structure provided by an embodiment of the present invention.

As illustrated in FIG. 2, a second sub-pixel column in a same column of pixels includes: a green sub-pixel, or a green sub-pixel and a blue sub-pixel, or a green sub-pixel, a red sub-pixel and a blue sub-pixel. That is to say, as compared with FIG. 1, in a pixel array structure illustrated in FIG. 2, a pixel located in lowermost of a third column of pixels is a BR 24, i.e., FIG. 2 adds a fourth pixel of BR 24 on the basis of FIG. 1, that is, as compared with the prior art, in the second column of sub-pixels in the third column of pixels, not only a first green sub-pixel is replaced by a blue sub-pixel, but also a last green sub-pixel in the column of sub-pixels is replaced by a red sub-pixel. Of course, only the last green sub-pixel in the column of sub-pixels may be replaced by a red sub-pixel, in this case, a second sub-pixel column in a same column of pixels includes: a green sub-pixel, or a green sub-pixel and a blue sub-pixel, or a green sub-pixel and a red sub-pixel. In short, there are a variety of manners for replacing a green sub-pixel by sub-pixels of other colors in any combination. Therefore, the embodiment of the present invention may improve an aperture ratio of blue or red sub-pixels, and further, when a green sub-pixel is replaced by a blue sub-pixel, since the number of blue sub-pixels is increased, and overall life time of an OLED product depends on characteristics of an OLED material, in general, a blue material has relatively short life time, life time of the blue color may be prolonged by improving an aperture ratio, so as to prolong a service life of the product.

Optionally, the first sub-pixel column is an odd-numbered sub-pixel column and the second sub-pixel column is an even-numbered sub-pixel column. Of course, the first sub-pixel column may also be an even-numbered sub-pixel column, and the second sub-pixel column may be an odd-numbered sub-pixel column.

In the pixel array structures illustrated in FIG. 1 and FIG. 2, in each pixel group, the second column of pixels and the fourth column of pixels are arranged in a same manner. In the first column and the third column of pixels, sub-pixels in first sub-pixel columns are arranged in a same manner, and sub-pixels in second sub-pixel columns are arranged in different manners.

The pixel arrangement manner illustrated in FIG. 1 or FIG. 2 is only an example, and the embodiment of the present invention may have other arrangement manners, for example, in each pixel group, the first column of pixels and the second column of pixels are arranged in a same manner; in the second column and the fourth column of pixels, sub-pixels in first sub-pixel columns are arranged in a same manner, and sub-pixels in second sub-pixel columns are arranged in different manners.

Optionally, each sub-pixel is in a rectangular shape, and has a same height, referring to FIG. 1 or FIG. 2. when in a same column of pixels, a first sub-pixel column includes a red sub-pixel and a blue sub-pixel, and a second sub-pixel column includes: a green sub-pixel, or a green sub-pixel and a blue sub-pixel, or a green sub-pixel and a red sub-pixel, or a green sub-pixel, a red sub-pixel and a blue sub-pixel, widths of the sub-pixels in the first sub-pixel column are greater than widths of the sub-pixels in the second sub-pixel column; when in a same column of pixels, a first sub-pixel column includes: a green sub-pixel, or a green sub-pixel and a blue sub-pixel, or a green sub-pixel and a red sub-pixel, or a green sub-pixel, a red sub-pixel and a blue sub-pixel, and a second sub-pixel column includes a red sub-pixel and a blue sub-pixel, widths of the sub-pixels in the second sub-pixel column are greater than widths of the sub-pixels in the first sub-pixel column. For example, optionally, the width of the sub-pixel in the first sub-pixel column is two times as wide as the sub-pixel in the second sub-pixel column, to make brightness of entire screen more uniform.

Optionally, the rectangle may be provided with a chamfer, that is, each sub-pixel may be of a chamfered rectangle, i.e., a rounded rectangle, so as to be more easily implemented, reduce technical difficulty, and further reduce fabrication cost.

Optionally, referring to FIG. 1 and FIG. 2, the red sub-pixel and the blue sub-pixel in the first sub-pixel column are arranged alternately, and red sub-pixels and blue sub-pixels in first sub-pixel columns of two adjacent columns of pixels are arranged in different manners. That is to say, the red sub-pixels and the blue sub-pixels are basically uniformly distributed, thus improving a display quality.

Optionally, when in a same column of pixels, a first sub-pixel column includes a red sub-pixel and a blue sub-pixel, and a second sub-pixel column includes: a green sub-pixel, or a green sub-pixel and a blue sub-pixel, or a green sub-pixel and a red sub-pixel, or a green sub-pixel, a red sub-pixel and a blue sub-pixel, a number of green sub-pixels is greater than that of sub-pixels of other colors in the same second sub-pixel column; when in a same column of pixels, a first sub-pixel column includes: a green sub-pixel, or a green sub-pixel and a blue sub-pixel, or a green sub-pixel and a red sub-pixel, or a green sub-pixel, a red sub-pixel and a blue sub-pixel, and a second sub-pixel column includes a red sub-pixel and a blue sub-pixel, a number of green sub-pixels is greater than that of sub-pixels of other colors in the same first sub-pixel column. That is to say, in the embodiment of the present invention, in order to ensure higher resolution, only a small part of green sub-pixels are replaced by the sub-pixels of other colors. Since the pixel array structure includes pixel groups arranged repeatedly, wherein each pixel group at least includes three types of pixels: a first pixel, a second pixel and a third pixel, each type of pixels include sub-pixels of at least two colors, and sub-pixels included in different types of pixels are different in color or sequence, as compared with the pentile array only having two types of pixels in the prior art, the embodiment of the present invention provides three types of pixels, so as to improve aperture ratios of part of color sub-pixels. Further, when the green sub-pixel is replaced by a blue sub-pixel, since a number of blue sub-pixels is increased, overall life time of the product is prolonged.

FIG. 1 is an example that a sub-pixel is in a rectangular shape, or is provided with a rectangular chamfer, wherein each pixel group which is arranged repeatedly includes 16 pixels of four rows, and four columns, wherein, pixels in the second column of pixels and the fourth column of pixels are arranged in a same manner, which are a BG pixel, a RG pixel, a BG pixel and a RG pixel from top to bottom, respectively; pixels in the first colunm of pixels are arranged in such a manner that a RG pixel, a BG pixel, a RB pixel and a BG pixel are arranged from top to bottom, respectively; and pixels in the third column of pixels are arranged in such a manner that a RB pixel, a BG pixel, a RG pixel and a BG pixel are arranged from top to bottom, respectively. The BG pixel is a pixel of a blue sub-pixel and a green sub-pixel from left to right, respectively; the RG pixel is a pixel of a red sub-pixel and a green sub-pixel from left to right, respectively; and the RB pixel is a pixel of a red sub-pixel and a blue sub-pixel from left to right, respectively.

Figure 3:
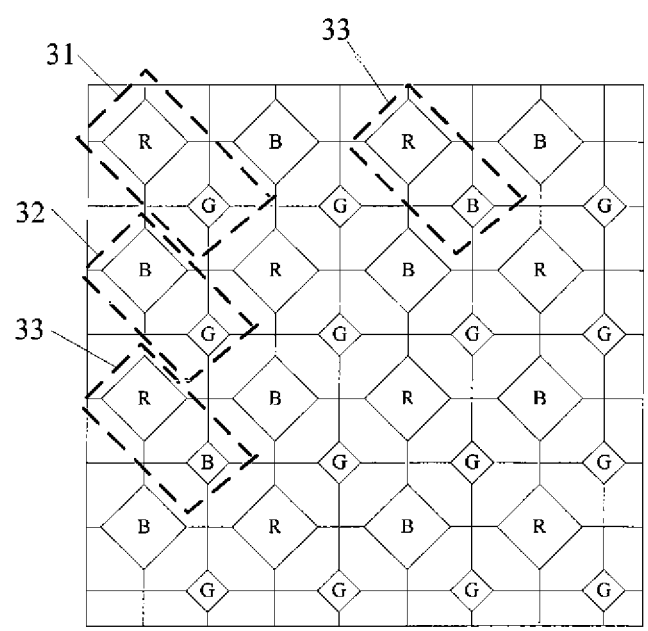
FIG. 3 is a schematic diagram of a third type of pixel array structure provided by an embodiment of the present invention.
Figure 4:
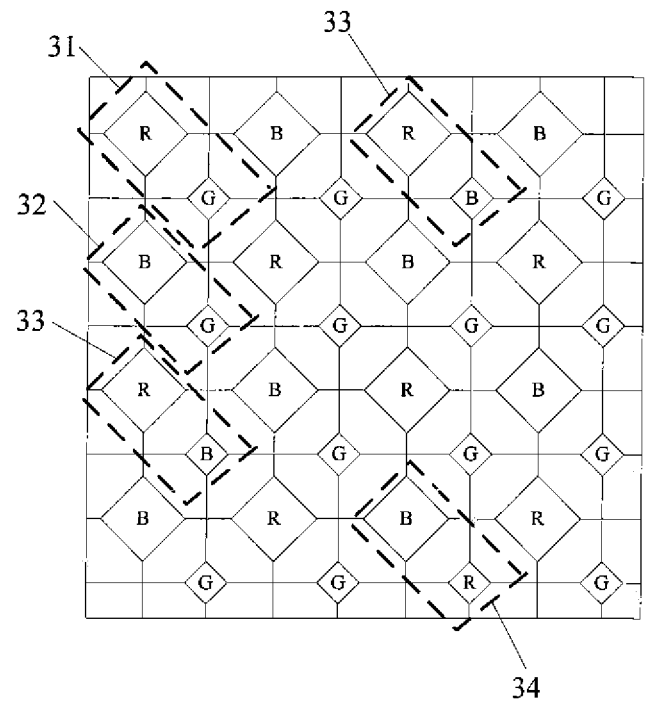
FIG. 4 is a schematic diagram of a fourth type of pixel array structure provided by an embodiment of the present invention.

Referring to FIG. 3 and FIG. 4, the sub-pixel may further be in a diamond shape, or be provided with a chamfered diamond.

For example, in the pixel array structure provided by the embodiment of the present invention, each pixel group includes m*n pixels, which includes 2m rows and 2n columns of sub-pixels, m and n may be natural numbers greater than or equal to 2.

Optionally, referring to FIG. 3 and FIG. 4, each pixel group includes 16 pixels, which includes 8 rows and 8 columns of sub-pixels. In FIG. 3, there are included three types of pixels: a pixel 31 including R and G sub-pixels, a pixel 32 including B and G sub-pixels, and a pixel 33 including R and B sub-pixels. In the embodiment of the present invention, sub-pixels in the pixel may be arranged in various sequences, which is not limited in the embodiment of the present invention.

Figure 5:
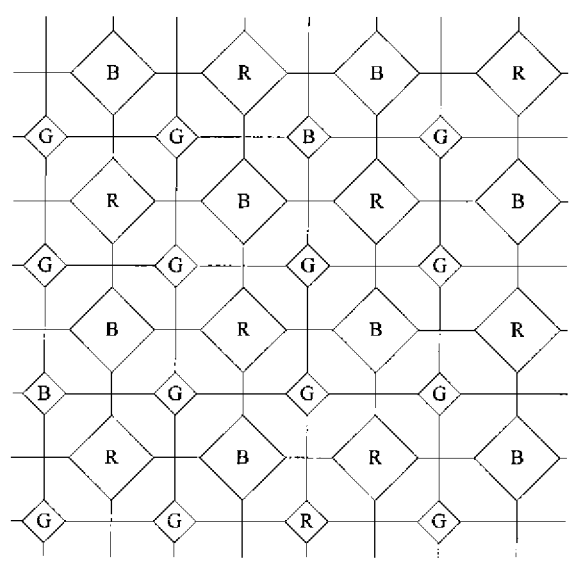
FIG. 5 is a schematic diagram of a fifth type of pixel array structure provided by an embodiment of the present invention.

In each pixel group, sub-pixels of an odd-numbered row include a red sub-pixel and a blue sub-pixel, and sub-pixels of an even-numbered row include: a green sub-pixel, or a green sub-pixel and a blue sub-pixel, or a green sub-pixel and a red sub-pixel, or a green sub-pixel, a red sub-pixel and a blue sub-pixel, as illustrated in FIG. 3, FIG. 4 and FIG. 5.

Figure 6:
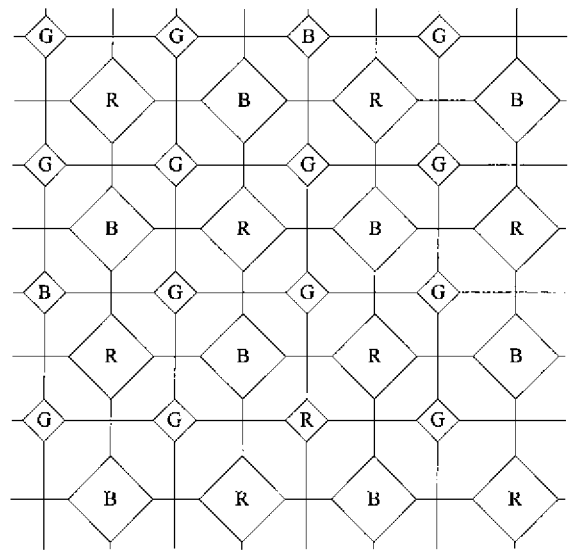
FIG. 6 is a schematic diagram of a sixth type of pixel array structure provided by an embodiment of the present invention.
Figure 7:
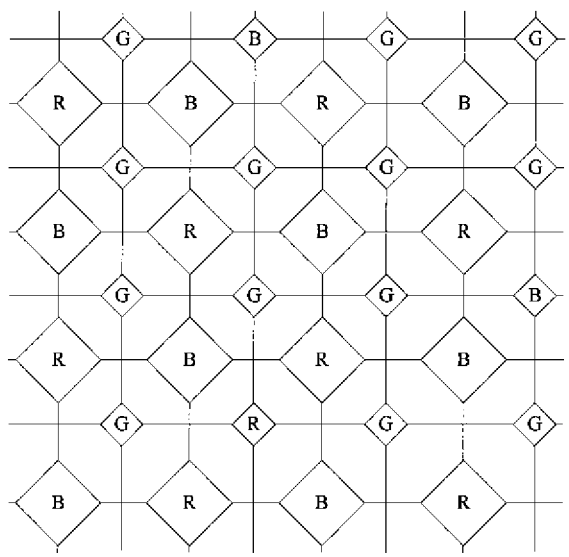
FIG. 7 is a schematic diagram of a seventh type of pixel array structure provided by an embodiment of the present invention.

Alternatively, as illustrated in FIG. 6, FIG. 7, sub-pixels of an even-numbered row include a red sub-pixel and a blue sub-pixel, and sub-pixels of an odd-numbered row include: a green sub-pixel, or a green sub-pixel and a blue sub-pixel, or a green sub-pixel and a red sub-pixel, or a green sub-pixel, a red sub-pixel and a blue sub-pixel; since the pixel array structure includes pixel groups arranged repeatedly, wherein each pixel group at least includes three types of pixels, each type of pixels include sub-pixels of at least two colors, and sub-pixels included in different types of pixels are different in color or sequence, as compared with the pentile array only having two types of pixels in the prior art, the embodiment of the present invention provides three types of pixels, so as to improve aperture ratios of part of color sub-pixels. Further, when the green sub-pixel is replaced by a blue sub-pixel, since a number of blue sub-pixels is increased, overall life time of the product is prolonged.

Furthermore, a connecting line between central points of first sub-pixels in two adjacent rows of sub-pixels is not parallel to a straight line where any row of sub-pixels are located, as illustrated in FIG. 3 and FIG. 4, a connecting line between a central point of a first sub-pixel R in the first row and a central point of a first sub-pixel in the second row is not parallel to a row direction.

Optionally, a distance between two adjacent sub-pixels in each row of sub-pixels is the same.

The foregoing is described by taking a unit of row, or it may be described in a unit of column as follows:

In each pixel group, sub-pixels of an odd-numbered column include a red sub-pixel and a blue sub-pixel, and sub-pixels of an even-numbered column include: a green sub-pixel, or a green sub-pixel and a blue sub-pixel, or a green sub-pixel and a red sub-pixel, or a green sub-pixel, a red sub-pixel and a blue sub-pixel.

Or, sub-pixels of an even-numbered column include a red sub-pixel and a blue sub-pixel, and sub-pixels of an odd-numbered column include: a green sub-pixel, or a green sub-pixel and a blue sub-pixel, or a green sub-pixel and a red sub-pixel, or a green sub-pixel, a red sub-pixel and a blue sub-pixel.

Furthermore, a connecting line between central points of first sub-pixels in two adjacent columns of sub-pixels is not parallel to a straight line where any column of sub-pixels are located.

Optionally, a distance between two adjacent sub-pixels in each column of sub-pixels is the same.

That is to say, in the pixel array structures illustrated in FIG. 3 and FIG. 4, in each pixel group, two sub-pixels of each pixel are arranged along a diagonal direction, and optionally, connecting lines of central points between two sub-pixels in any pixel are parallel to each other.

Further, as compared with FIG. 3, in FIG. 4, the last sub-pixel in the sixth column of sub-pixels is a red sub-pixel, i.e., a red sub-pixel in the pixel BR 34, that is, the pixel group illustrated in FIG. 4 includes four pixels.

In the pixel array structures illustrated in FIG. 3 and FIG. 4, in each pixel group:

The sub-pixels of an odd-numbered row and an odd-numbered column include a red sub-pixel and a blue sub-pixel, and the sub-pixels of an even-numbered row and an even-numbered column include: a green sub-pixel, or a green sub-pixel and a blue sub-pixel, or a green sub-pixel and a red sub-pixel, or a green sub-pixel, a red sub-pixel and a blue sub-pixel;

Or, the sub-pixels of an even-numbered row and an even-numbered column include a red sub-pixel and a blue sub-pixel, and the sub-pixels of an odd-numbered row and an odd-numbered column include: a green sub-pixel, or a green sub-pixel and a blue sub-pixel, or a green sub-pixel and a red sub-pixel, or a green sub-pixel, a red sub-pixel and a blue sub-pixel.

Optionally, if the sub-pixels of an odd-numbered row include a red sub-pixel and a blue sub-pixel, the red sub-pixel and the blue sub-pixel in the sub-pixels of any odd-numbered row are arranged alternately;

If the sub-pixels of an even-numbered row include a red sub-pixel and a blue sub-pixel, the red sub-pixel and the blue sub-pixel in the sub-pixels of any even-numbered row are arranged alternately.

It should be noted that, a column of sub-pixels where the green sub-pixel is located is regarded as a first column of sub-pixels, that is, the sub-pixels of an odd-numbered column may include: a green sub-pixel, or a green sub-pixel and a blue sub-pixel, or a green sub-pixel and a red sub-pixel, or a green sub-pixel, a red sub-pixel and a blue sub-pixel, and the sub-pixels of an even-numbered row may include: a green sub-pixel, or a green sub-pixel and a blue sub-pixel, or a green sub-pixel and a red sub-pixel, or a green sub-pixel, a red sub-pixel and a blue sub-pixel, as illustrated in FIG. 5.

Further, a row of sub-pixels where the green sub-pixel is located is regarded as a first row of sub-pixels, that is, not only the sub-pixels of an odd-numbered column include: a green sub-pixel, or a green sub-pixel and a blue sub-pixel, or a green sub-pixel and a red sub-pixel, or a green sub-pixel, a red sub-pixel and a blue sub-pixel, but also the sub-pixels of an odd-numbered row may include: a green sub-pixel, or a green sub-pixel and a blue sub-pixel, or a green sub-pixel and a red sub-pixel, or a green sub-pixel, a red sub-pixel and a blue sub-pixel, as illustrated in FIG. 6.

Or, a row of sub-pixels where the green sub-pixel is located is regarded as a first row of sub-pixels, that is, the sub-pixels of an odd-numbered row include: a green sub-pixel, or a green sub-pixel and a blue sub-pixel, or a green sub-pixel and a red sub-pixel, or a green sub-pixel, a red sub-pixel and a blue sub-pixel, and the sub-pixels of an even-numbered column include: a green sub-pixel, or a green sub-pixel and a blue sub-pixel, or a green sub-pixel and a red sub-pixel, or a green sub-pixel, a red sub-pixel and a blue sub-pixel, as illustrated in FIG. 7.

Optionally, each sub-pixel is in a diamond shape; in two diagonal lines of the diamond, one diagonal line is parallel to a straight line where any sub-pixel row is located, and the other diagonal line is parallel to a straight line where any sub-pixel column is located.

Optionally, the diamond is provided with a chamfer, that is, each sub-pixel is of a rounded diamond, so as to be more easily implemented, reduce technical difficulty, and further reduce fabrication cost.

Optionally, if the sub-pixels of an odd-numbered row include a red sub-pixel and a blue sub-pixel, areas of the sub-pixels in the sub-pixels of the odd-numbered row are greater than those of sub-pixels in the sub-pixels of the even-numbered row and the sub-pixels of the even-numbered column.

Or, if the sub-pixels of an even-numbered row include a red sub-pixel and a blue sub-pixel, areas of the sub-pixels in the sub-pixels of an even-numbered row are greater than those of sub-pixels in the sub-pixels of the odd-numbered row and the sub-pixels of the odd-numbered column.

Optionally, a distance between adjacent sub-pixels in any sub-pixel column is the same, and a distance between adjacent sub-pixels in any sub-pixel row is the same.

Optionally, an included angle, between a connecting line of a central point of a first sub-pixel in a column of sub-pixels and a central point of a first sub-pixel in the other column of sub-pixels in two adjacent columns of sub-pixels and a straight line where any row of sub-pixels are located, is greater than zero.

Figure 10:
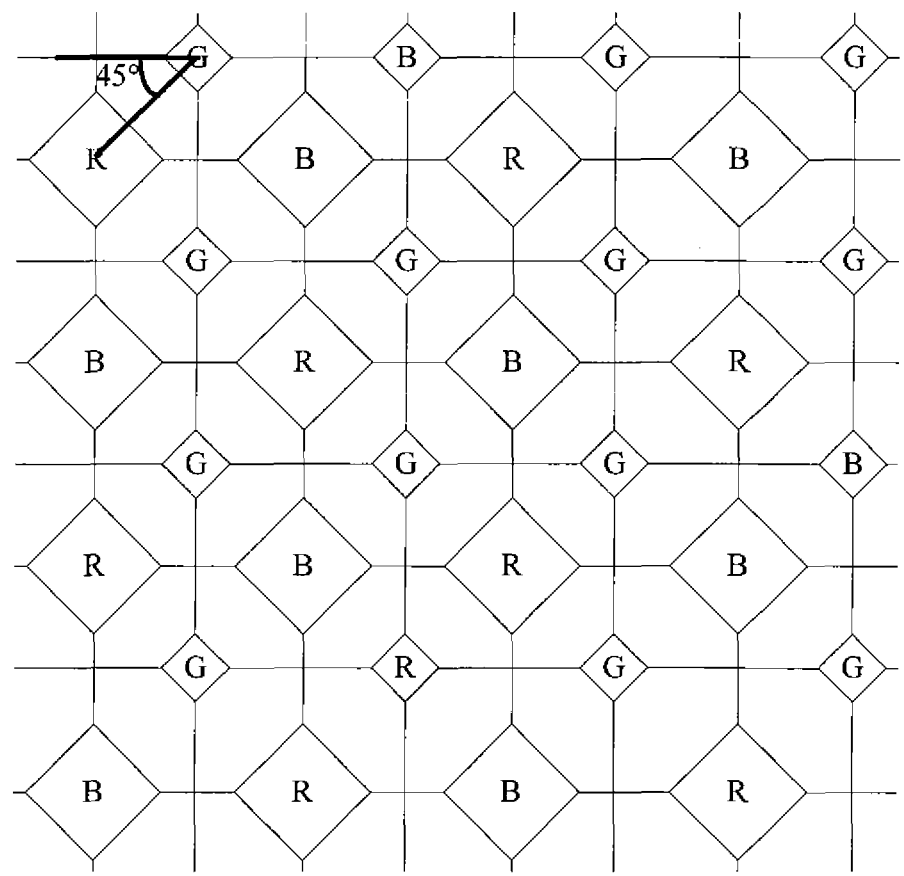
FIG. 10 is a schematic diagram in which, an included angle between a connecting line of a central point of a first sub-pixel in a column of sub-pixels and a central point of a first sub-pixel in the other column of sub-pixels in two adjacent column of sub-pixels and a straight line where any row of sub-pixels row are located, is 45 degree, which is provided by an embodiment of the present invention.

Optionally, the included angle is 45 degree, as illustrated in FIG. 10, an included angle, between a connecting line of a central point of a first sub-pixel G in a second column of sub-pixels and a central point of a first sub-pixel R in a first column of sub-pixels and a horizontal line (i.e., a straight line where any row of sub-pixels are located), is 45 degree.

Hereinafter, the pixel array structure illustrated in FIG. 3 is described in detail; as illustrated in FIG. 3, each pixel group includes 16 pixels of four rows and four columns, wherein, pixels in the second column of pixels and the fourth column of pixels are arranged in a same manner, which are a BG pixel, a RG pixel, a BG pixel and a RG pixel from top to bottom, respectively; pixels in the first column of pixels are arranged in such a manner that a RG pixel, a BG pixel, a RB pixel and a BG pixel are arranged from top to bottom, respectively; and pixels in the third column of pixels are arranged in such a manner that a RB pixel, a BG pixel, a RG pixel and a BG pixel are arranged from top to bottom, respectively. The BG pixel is a pixel of a blue sub-pixel and a green sub-pixel from left to right, respectively; the RG pixel is a pixel of a red sub-pixel and a green sub-pixel from left to right, respectively; and the RB pixel is a pixel of a red sub-pixel and a blue sub-pixel from left to right, respectively. The first column of pixels include first and second columns of sub-pixels, the second column of pixels include third and fourth columns of sub-pixels, the third column of pixels include fifth and sixth columns of sub-pixels, and the fourth column of pixels include seventh and eighth columns of sub-pixels; however, what is different from FIG. 1 and FIG. 2 is that, for each pixel in each column of pixels, two sub-pixels thereof are arranged along a diagonal direction (an included angle of 45 degree is between the diagonal line and the horizontal line).

Figure 11:
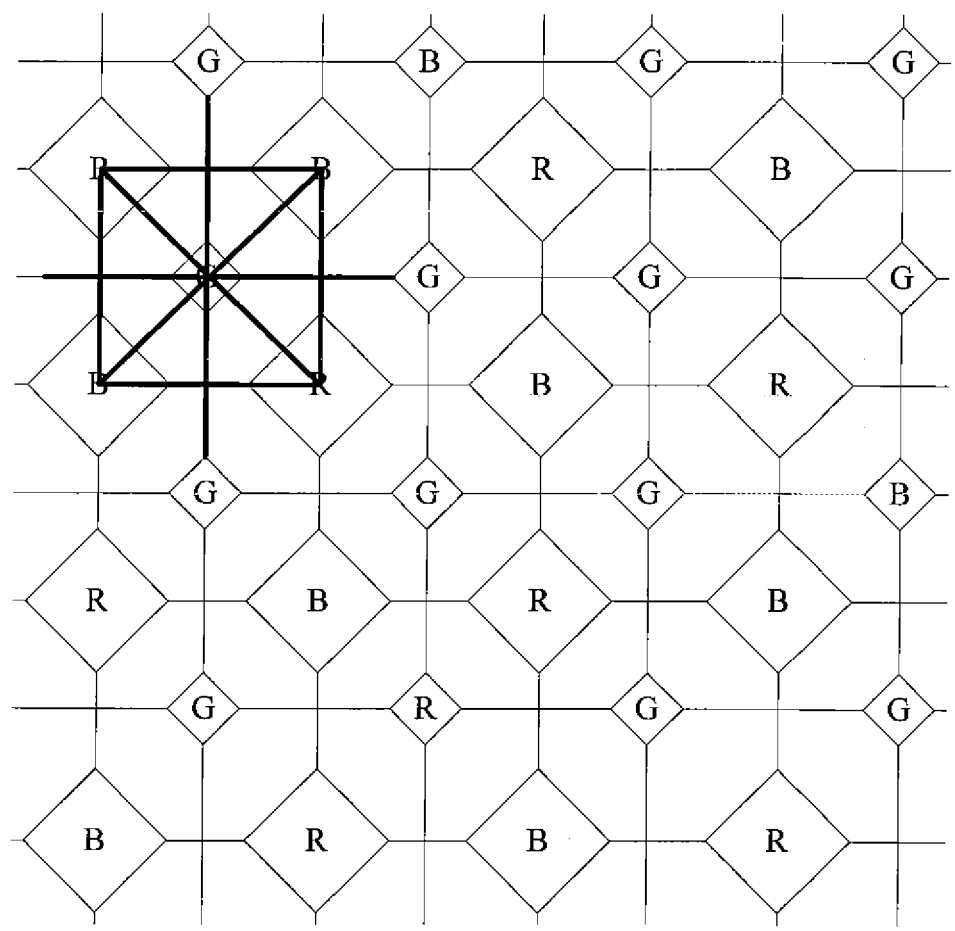
FIG. 11 is a schematic diagram in which, a central point of any color sub-pixel is located in a perpendicular bisector of a connecting line between central points of two sub-pixels adjacent to the color sub-pixel in a row or column adjacent to the color sub-pixel, which is provided by an embodiment of the present invention.

Optionally, referring to FIGS. 3 to 7, a central point of any color sub-pixel is located in a perpendicular bisector of a connecting line between central points of two sub-pixels adjacent to the color sub-pixel in a row or column adjacent to the color sub-pixel. As illustrated in FIG. 11, a central point of a second sub-pixel in the second column of sub-pixels is located in a perpendicular bisector of a connecting line between central points of a first sub-pixel R and a second pixel B in the first row of sub-pixels, and is also located in a perpendicular bisector of a connecting line between central points of a first sub-pixel R and a second pixel B in the first column of sub-pixels. For example, a central point of any green sub-pixel is located in a perpendicular bisector of a connecting line between central points of a red sub-pixel and a blue sub-pixel adjacent to the green sub-pixel in a row or column adjacent to the green sub-pixel, i.e., in FIGS. 3 to 7, a central point of any sub-pixel having smaller area coincides with a central point of a square formed by four sub-pixels having greater areas adjacent to the sub-pixel having smaller area, so as to make the sub-pixels distributed more uniformly, further improving a display effect.

It can be seen that, as compared with the prior art, the pixel array structure provided by the embodiment of the present invention utilizes characteristics of a high-resolution screen, to partially replace the green sub-pixels showing actual resolution, i.e., to replace part of the green sub-pixels by the red and/or blue sub-pixels.

Further, since a number of sub-pixels in whole picture is evenly distributed, and the red and blue sub-pixels are not a small number of sub-pixels, there is no color cast problem.

Based on the respective pixel array structures provided by the embodiments of the present invention, a SubPixel Rendering (SPR) technology may be further used, with a concept of sharing color (or borrowing color), to change that three sub-pixels of different colors are needed to be used as one pixel in an existing pixel arrangement to that only two sub-pixels of different colors are needed to be used as one pixel for display, thereby reducing difficulty in design. Furthermore, the embodiment of the present invention utilizes a high-resolution characteristic of green color, on a premise of maintaining most of the green sub-pixels, a small part of the green sub-pixels are replaced by the red sub-pixels and/or the blue sub-pixels, to achieve an effect of maintaining image quality and improving aperture ratios of the red sub-pixels and/or blue sub-pixels.

With respect to the SPR technology described above, an SPR algorithm may select various manners of borrowing color to adapt to various displayed images according to image data, so as to effectively improve quality of the displayed images. In particular, the image data may be converted into brightness space by operations, and the brightness is calculated to satisfy visual feeling of human eyes, wherein the calculation of brightness mainly includes two types:

Data mapping: original image data converted to the brightness space is displayed in a new pixel array structure provided by the embodiment of the present invention.

Image quality improve engine: because any pixel provided by the embodiment of the present invention only has two sub-pixels for display, it is easy to cause problems of discontinuous lines and color edges, but most of discomforts in the image may be solved by the algorithm.

Based on the respective pixel array structures provided by the embodiments of the present invention, manners of borrowing color may be divided into two types: borrowing color from left and right sides and borrowing color from upper and lower sides. However, the color is borrowed from sub-pixels adjacent thereto, from one sub-pixel at least and from four sub-pixels at most.

Figure 8:
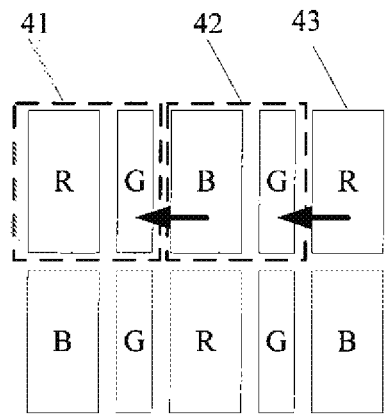
FIG. 8 is a schematic diagram of a manner for borrowing a sub-pixel between pixels provided by an embodiment of the present invention.

Referring to FIG. 8, a pixel 41 is a RG pixel; due to lack of a blue sub-pixel, it borrows color from a sub-pixel B in a pixel 42 adjacent thereto on its right side, that is, a blue sub-pixel in the pixel 42 is borrowed by the pixel 41 including a red sub-pixel and a green sub-pixel. Similarly, a pixel 42 is a BG pixel; due to lack of a red sub-pixel, it borrows color from a sub-pixel R in a pixel 43 adjacent thereto on its right side, that is, a red sub-pixel in the pixel 43 is borrowed by the pixel 42 including a blue sub-pixel and a green sub-pixel.

Figure 9:
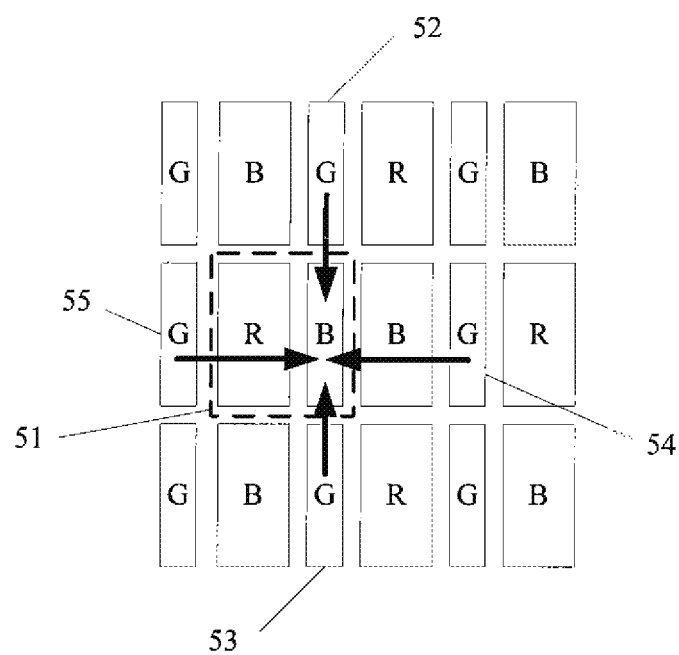
FIG. 9 is a schematic diagram of a manner for borrowing a sub-pixel between pixels provided by an embodiment of the present invention.

Referring to FIG. 9, a pixel 51 is a RB pixel, i.e., a pixel including a red sub-pixel and a blue sub-pixel; due to lack of a green sub-pixel, it borrows color from a sub-pixel adjacent thereto, and there are four directions totally, i.e., a sub-pixel 55 from left side, a sub-pixel 54 from right side, a sub-pixel 52 from upper side and a sub-pixel 53 from lower side, a green sub-pixel in the four directions may be borrowed by the pixel 51, to compensate a green sub-pixel which is not included in the pixel 51. But preferably, in this case, it usually borrows color from two directions of upper and lower sides, which are closer, so that a better display effect is achieved.

An embodiment of the present invention provides a display device, including any one of the pixel array structures provided by the embodiments of the present invention. The display device may be a display panel, an OLED display device, a mobile phone, a tablet computer, a computer and a monitor, etc., which is not limited here.

In summary, the embodiments of the present invention provide a pixel array structure and a display device including the pixel array structure, including pixel groups arranged repeatedly, wherein each pixel group at least includes three types of pixels: a first pixel, a second pixel and a third pixel, each type of pixels include sub-pixels of at least two colors, and sub-pixels included in different types of pixels are different in color or sequence.

Since the pixel array structure includes pixel groups arranged repeatedly, wherein each pixel group at least includes three types of pixels: a first pixel, a second pixel and a third pixel, each type of pixels include sub-pixels of at least two colors, and sub-pixels included in different types of pixels are different in color or sequence, as compared with the pentile array only having two types of pixels in the prior art, the embodiment of the present invention provides three types of pixels, so as to improve aperture ratios of part of color sub-pixels.

And, as compared with that one pixel is formed by three sub-pixels in the prior art, in the embodiment of the present invention, one pixel is formed by two sub-pixels, which reduces a number of actual sub-pixels in a display screen, and further reduces difficulty in process and backboard design.

Further, when a SPR technology is used on the basis of the pixel array structure provided by the embodiment of the present invention, the display quality of the image may be further improved. Furthermore, when an Image Quality Improve Engine is used, fineness and smoothness of blue lines may be improved.

When the blue sub-pixels are added in the pixel array structure provided by the embodiment of the present invention, overall life time of the product may be prolonged.

The foregoing embodiments merely are exemplary embodiments of the present invention, and not intended to define the scope of the present invention, and the scope of the invention is determined by the appended claims.

The present application claims priority of Chinese Patent Application No. 201510083287.3 filed on Feb. 15, 2015, the invention of which is incorporated herein by reference in its entirety as part of the present application.

The invention claimed is:

1. A pixel array structure, comprising a plurality of pixel groups, wherein each pixel group includes a plurality of pixels arranged along a row direction and a column direction, the plurality of pixels at least including a first type of pixels, a second type of pixels and a third type of pixels, each type of pixels including sub-pixels of at least two colors, and sub-pixels included in different types of pixels being different in color and sequence, each pixel group includes m*n pixels of m rows and n columns, m and n being natural numbers greater than or equal to 2, wherein, the first type of pixels include a first color sub-pixel and a second color sub-pixel; the second type of pixels include a third color sub-pixel and the second color sub-pixel; and the third type of pixels include the first color sub-pixel and the third color sub-pixel, the first color sub-pixel is a red pixel; the second color sub-pixel is a green pixel; and the third color sub-pixel is a blue pixel, and wherein the plurality of pixel groups are arranged repeatedly in such a manner that, in any adjacent two pixel groups along a row direction and a column direction, any third type of pixels is directly adjacent only with the second type of pixels along the row direction and the column direction.

2. The pixel array structure according to claim 1, wherein, pixels of a same type are not adjacent to each other in the row direction and the column direction.

3. The pixel array structure according to claim 1, wherein, each sub-pixel is in a polygonal shape.

4. The pixel array structure according to claim 1, wherein, the odd-numbered sub-pixel column includes a first sub-pixel column, and the even-numbered sub-pixel column includes a second sub-pixel column.

5. The pixel array structure according to claim 1, wherein, each sub-pixel is in a rectangular shape, and has a same height, and the rectangle is provided with a chamfer.

6. The pixel array structure according to claim 4, wherein, red sub-pixels and blue sub-pixels in the second sub-pixel column are arranged alternately, and red sub-pixels and blue sub-pixels in second sub-pixel columns of two adjacent columns of pixels are arranged in different manners.

7. The pixel array structure according to claim 4, wherein, a number of green sub-pixels is greater than that of sub-pixels of other colors in a same first sub-pixel column.

8. The pixel array structure according to claim 4, wherein, each pixel group includes 16 pixels of four rows and four columns, wherein, pixels in the second column of pixels and the fourth column of pixels are arranged in a same manner, which are a BG pixel, a RG pixel, the BG pixel, the RG pixel from top to bottom, respectively; pixels in the first column of pixels are arranged in such a manner that the RG pixel, the BG pixel, a RB pixel and the BG pixel are arranged from top to bottom, respectively; and pixels in the third column of pixels are arranged in such a manner that the RB pixel, the BG pixel, the RG pixel and the BG pixel are arranged from top to bottom, respectively, wherein, the BG pixel is a pixel of the blue sub-pixel and the green sub-pixel from left to right, respectively; the RG pixel is a pixel of the red sub-pixel and the green sub-pixel from left to right, respectively; and the RB pixel is a pixel of the red sub-pixel and the blue sub-pixel from left to right, respectively.

9. The pixel array structure according to claim 1, wherein, each pixel group includes m*n pixels, which includes 2m rows and 2n columns of sub-pixels, m and n being natural numbers greater than or equal to 2;

sub-pixels of an even-numbered row include the red sub-pixel and the blue sub-pixel, and sub-pixels of an odd-numbered row include: the green sub-pixel, or the green sub-pixel and the blue sub-pixel, or the green sub-pixel and the red sub-pixel, or the the green sub-pixel, the red sub-pixel and the blue sub-pixel;

and, a connecting line between central points of first sub-pixels in two adjacent rows of sub-pixels is not parallel to a straight line where any row of sub-pixels are located.

10. The pixel array structure according to claim 9, wherein, a distance between two adjacent sub-pixels in each row of sub-pixels is the same.

11. The pixel array structure according to claim 9, wherein, the sub-pixels of an even-numbered row include the red sub-pixel and the blue sub-pixel, and the red sub-pixel and the blue sub-pixel in the sub-pixels of any even-numbered row are arranged alternately.

12. The pixel array structure according to claim 9, wherein, each sub-pixel is in a diamond shape; in two diagonal lines of the diamond, one diagonal line is parallel to a straight line where any row of sub-pixels are located, and. the other diagonal line is parallel to a straight line where any column of sub-pixels are located.

13. The pixel array structure according to claim 12, wherein, the diamond is provided with a chamfer.

14. The pixel array structure according to claim 9, wherein, the sub-pixels of an even-numbered row include the red sub-pixel and the blue sub-pixel, and areas of the sub-pixels in the sub-pixels of the even-numbered row are greater than those of the sub-pixels in the sub-pixels of an odd-numbered row and the sub-pixels of the odd-numbered column.

15. The pixel array structure according to claim 14, wherein, a distance between two adjacent sub-pixels in any sub-pixel column is the same, and a distance between two adjacent sub-pixels in any sub-pixel row is the same.

16. The pixel array structure according to claim 14, wherein, an included angle, between a connecting line of a central point of a first sub-pixel in a column of sub-pixels and a central point of a first sub-pixel in the other column of sub-pixels in two adjacent columns of sub-pixels and a straight line where any row of sub-pixels row are located, is greater than zero.

17. The pixel array structure according to claim 16, wherein, the included angle is 45 degree.

18. The pixel array structure according to claim 9, wherein, a central point of any color sub-pixel is located in a perpendicular bisector of a connecting line between central points of two sub-pixels adjacent to the color sub-pixel in a row or column adjacent to the color sub-pixel.

19. A display device, comprising the pixel array structure according to claim 1.

20. The pixel array structure according to claim 1, wherein each sub-pixel is in a rectangular shape, and has a same height; in a same column of pixels, widths of the sub-pixels in a sub-pixel column including only the first color sub-pixel and the third color sub-pixel are greater than widths of the sub-pixels in a sub-pixel column including the second color sub-pixel.

* * * * *